(12) United States Patent
Remy et al.

(10) Patent No.: US 11,404,223 B2
(45) Date of Patent: Aug. 2, 2022

(54) METHOD AND DEVICE FOR DIAGNOSING WEAR OF AN ELECTRICAL SWITCHING UNIT, AND ELECTRICAL UNIT COMPRISING SUCH A DEVICE

(71) Applicant: Schneider Electric Industries SAS, Rueil Malmaison (FR)

(72) Inventors: Mael Eugene Alain Remy, Grenoble (FR); Jose Desforges, Seyssins (FR); Francois Jean Maurice Rolard, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 15/831,541

(22) Filed: Dec. 5, 2017

(65) Prior Publication Data

US 2018/0174768 A1    Jun. 21, 2018

(30) Foreign Application Priority Data

Dec. 16, 2016    (FR) ..................... 16 62576

(51) Int. Cl.
*H01H 1/00* (2006.01)
*G01R 19/00* (2006.01)
(Continued)

(52) U.S. Cl.
CPC ....... *H01H 1/0015* (2013.01); *G01R 19/0046* (2013.01); *G01R 31/3274* (2013.01);
(Continued)

(58) Field of Classification Search
CPC ............ G01R 31/3333; G01R 31/3274; H01H 57/04; H01H 51/04
See application file for complete search history.

(56) References Cited

U.S. PATENT DOCUMENTS

2004/0223276 A1    11/2004  Wimmer
2005/0122117 A1    6/2005   Baurand et al.
(Continued)

FOREIGN PATENT DOCUMENTS

DE          103 52 580 B3       4/2005
DE     10 2011 016 895 A1       10/2012
(Continued)

OTHER PUBLICATIONS

Gluss, "A Line Segment Curve-Fitting Algorithm Related to Optimal Encoding of Information", Information and Control 5, 261-267 (1962). (Year: 1962).*

(Continued)

*Primary Examiner* — Jennifer Bahls
(74) *Attorney, Agent, or Firm* — Oblon, McClelland, Maier & Neustadt, L.L.P.

(57) ABSTRACT

A method for diagnosing the state of wear of an electrical switching unit including an electrical unit monitoring phase. The monitoring phase uses learning data loaded previously and representative of the type of electrical unit, and initialization data corresponding to the unit to be monitored and stored in an initialization phase. The monitoring phase includes the measurement and the acquisition of a measurement curve on opening the electrical unit, the determination of the value of local descriptors of the measurement curve as a function of values of the measurement curve, of initialization data and of learning data, the determination of the positioning of local descriptor values, the determination of an overall state class as a function of the positioning values. The device and the electrical unit implement the method.

16 Claims, 7 Drawing Sheets

(51) Int. Cl.
*G01R 31/327* (2006.01)
*G01R 31/52* (2020.01)
*G01R 31/333* (2006.01)
*H01H 51/04* (2006.01)
*H01H 71/04* (2006.01)

(52) U.S. Cl.
CPC ......... *G01R 31/3333* (2013.01); *G01R 31/52* (2020.01); *H01H 51/04* (2013.01); *H01H 2071/044* (2013.01)

(56) References Cited

U.S. PATENT DOCUMENTS

| | | |
|---|---|---|
| 2007/0051595 A1 | 3/2007 | Dohnal et al. |
| 2007/0222427 A1 | 9/2007 | Takeuchi et al. |
| 2010/0161255 A1* | 6/2010 | Mian ............... G01N 29/041 702/56 |
| 2012/0253695 A1 | 10/2012 | Schrag et al. |
| 2013/0103334 A1* | 4/2013 | Delbaere ........... G01R 19/0046 702/64 |
| 2016/0131713 A1 | 5/2016 | Edwards et al. |

FOREIGN PATENT DOCUMENTS

| | | |
|---|---|---|
| EP | 1 475 813 A1 | 11/2004 |
| EP | 2 328 159 A1 | 6/2011 |
| EP | 2 584 575 A1 | 4/2013 |
| EP | 2 975 622 A1 | 1/2016 |
| FR | 2 942 068 | 8/2010 |
| GB | 2 1 58 253 A | 11/1985 |
| WO | WO 03/054895 A1 | 7/2003 |
| WO | WO 2005/1041 55 A1 | 11/2005 |
| WO | WO 2012/072810 A1 | 6/2012 |

OTHER PUBLICATIONS

French Preliminary Search Report dated Oct. 16, 2017 in French Application 16 62576, filed on Dec. 16, 2016 (with English Translation of Categories of cited documents & Written Opinion).

Magne Runde, et al. "Condition Assessment of Contacts in Gas-Insulated Substations", IEEE Transactions on Power Delivery, vol. 19, No. 2, 2004, 6 pages.

* cited by examiner

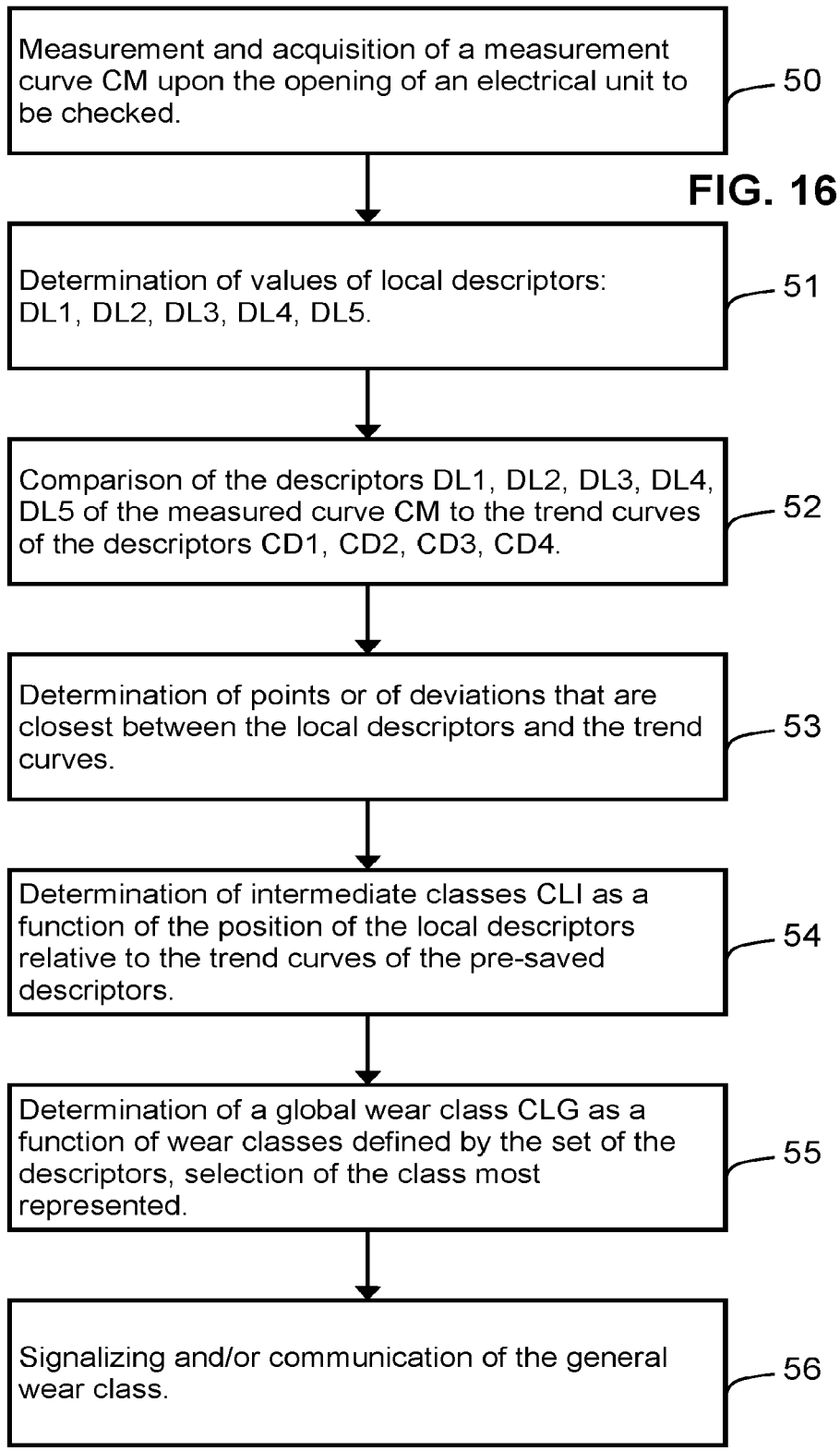

METHOD AND DEVICE FOR DIAGNOSING WEAR OF AN ELECTRICAL SWITCHING UNIT, AND ELECTRICAL UNIT COMPRISING SUCH A DEVICE

TECHNICAL FIELD

The invention relates to a method for diagnosing the state of wear of an electrical switching unit comprising a phase of monitoring of said electrical unit.

The invention relates also to a diagnostic device and a unit implementing the method.

STATE OF THE ART

The methods and devices for diagnosing the state of electrical units generally check one or more electrical characteristics by comparing them to a pattern of values. These characteristics generally include a voltage, a current or a time marker of a noteworthy point of an electrical signal. A diagnostic method of this type is disclosed in the patent application EP2584575.

Other methods determine the wear of contacts of electrical units such as contacts by assessing a time between two events or the duration of an event. For example, a time between the ordering of the opening or of the closure of contacts and the actual moment of said opening or closure. A patent application WO03054895 describes a particular way of detecting the wear of contacts of an electrical unit as a function of the moment of the appearance of a primary current after a control command.

The known diagnostic methods and devices offer satisfactory results that are not easy to deploy on existing units or units already installed. Generally, an intervention is required in the electrical units. Furthermore, there is a need to have more details and higher levels of certainty for the monitoring of certain electrical units such as contactors.

SUMMARY OF THE INVENTION

The aim of the invention is a method and a device for diagnosing an electrical unit that gives a result having improved certainty and being easy to implement on electrical units.

According to the invention, in a method for diagnosing the state of wear of an electrical switching unit comprising a phase of monitoring of said electrical unit,
said monitoring phase uses:
  learning data loaded previously and corresponding to a type of product representative of said electrical unit, and
  initialization data corresponding to said unit to be monitored and stored in an initialization phase,
and
said monitoring phase comprises:
  the measurement and the acquisition of a measurement curve on opening of said electrical unit,
  the determination of values of local descriptors of said measurement curve as a function of values of said measurement curve, of saved initialization data, and of first learning data loaded,
  the determination of the positioning of values of local descriptors of the measurement curve relative to second learning data, and
  the determination of an overall status class as a function of said values of positionings of the values of local descriptors and of the measurement curve relative to said second learning data.

Preferably, in the diagnostic method, the determination of an overall status class comprises:
  at least three determinations of intermediate status classes as a function of positionings closest to said local descriptors, and
  the selection of said overall class as a function of said intermediate classes.

Advantageously, a first descriptor is representative of the difference in value between two noteworthy points of said measurement curve.

Preferably, in the diagnostic method:
  initialization data comprise at least one reference curve specific to the product to be monitored saved at the start of the life of the product after stabilization of the measurements, and
  a second descriptor is representative of the deviation between a measurement curve and said specific reference curve, the more distant the measurement curve is from the specific reference curve, the more the unit will be considered to be worn.

Preferably, in the diagnostic method:
  loaded learning data comprise at least one reference curve of a worn unit corresponding to an electrical signal during an opening of a worn unit, and
  a third descriptor is representative of the deviation between a measurement curve and said worn reference curve, the closer the measurement curve is to the worn reference curve, the more the unit will be considered to be worn.

Advantageously, a fourth descriptor corresponds to a curve surface or to an integral between two noteworthy points of the measurement curve or to two thresholds of values in a first direction of variation and in a second, opposite direction of variation.

Advantageously, a fifth descriptor corresponds to a variation of value of a noteworthy point such as the change of sign of the variation of a signal on the measurement curve.

Advantageously, loaded learning data are representative of trend curves of descriptors representative of predefined characteristics of said electrical signal during the life of said electrical unit.

Preferably, said trend curves of descriptors are loaded in a straight line segment definition format to reduce the memory space needed for said learning data.

In a preferred embodiment, values of said trends curves of descriptors that are preloaded are associated with status or wear classes of units to be monitored.

According to a particular embodiment, the method comprises:
  a preliminary learning phase for recording, during a predetermined number of manoeuvres, learning data representative:
    of at least one reference curve of a worn unit corresponding to an electrical signal during an opening of said worn unit, and
    of at least two trend curves of descriptors representative of predefined characteristics of said electrical signal during the life of said electrical unit,
  a storage of said learning data,
  the loading of said learning data, and
  the use of the learning data in said electrical unit monitoring phase.

Preferably, the method comprises an initialization phase for determining said initialization data comprising said specific reference curve of the product to be monitored determined:
- after a predetermined number of measurements, and/or when the measurement curve varies very little between two consecutive measurements,
- the saving of said specific reference curve, and
- the use of the initialization data in said electrical unit monitoring phase.

According to the invention, in a device for diagnosing the state of wear of an electrical switching unit connected to an electromagnetic coil actuating contacts of said electrical switching unit, the diagnostic device comprises a processing circuit for implementing the diagnostic method defined above.

In a particular embodiment, the processing circuit comprises a local diagnostic processing module close to said unit linked to an external processing module remote from said unit.

According to the invention, an electrical unit, comprising power electrical contacts actuated by an electromagnetic control coil, comprises a device for diagnosing the state of wear of the electrical switching unit connected to said electromagnetic coil actuating said contacts and implementing the diagnostic method defined above.

BRIEF DESCRIPTION OF THE DRAWINGS

Other advantages and features will emerge more clearly from the following description of particular embodiments of the invention, given as nonlimiting examples, and represented in the attached drawings in which:

FIG. 16 represents steps of a monitoring phase of a method according to an embodiment of the invention.

DETAILED DESCRIPTION OF EMBODIMENTS

Figure 1:
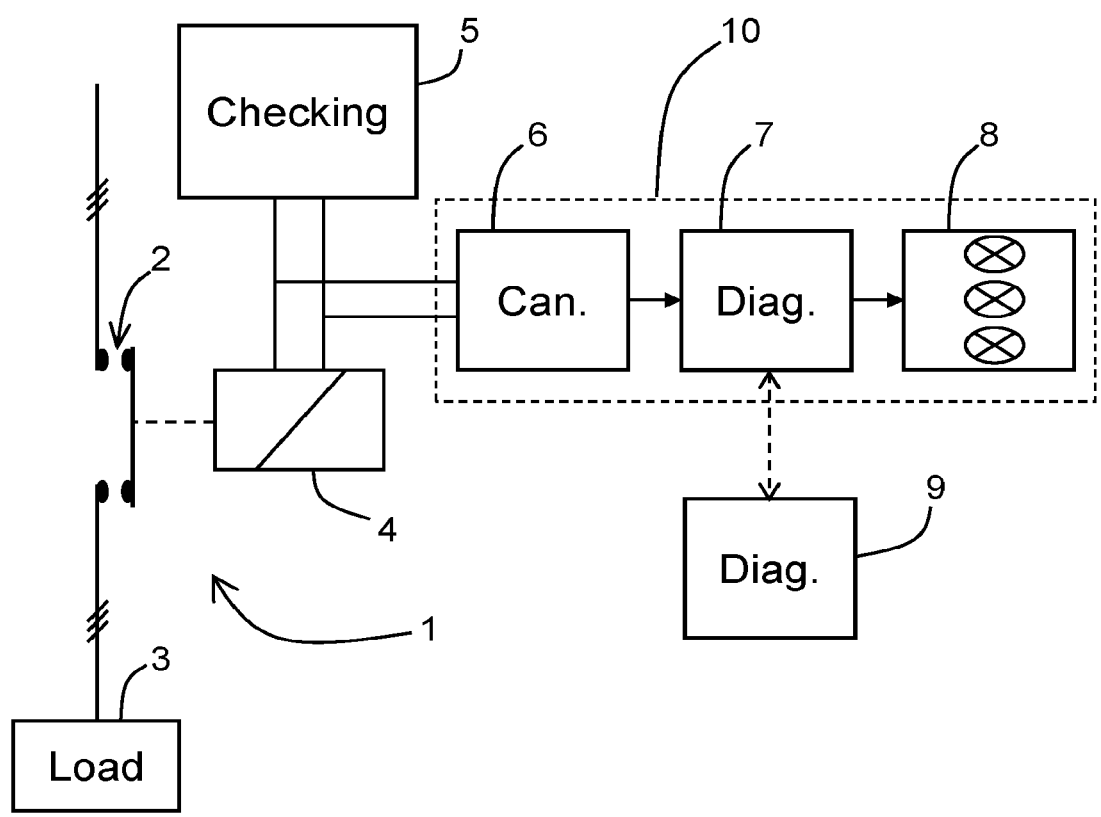
FIG. 1 represents an overall diagram of an electrical unit comprising a monitoring device according to an embodiment of the invention.

In FIG. 1, an electrical unit 1 of contactor type comprises one or more power electrical contacts 2 for supplying power to or stopping the electrical power supply to a load 3. The electrical contacts are controlled by an electromagnetic coil 4. A command or control circuit 5 controls the electromagnetic coil 4 to close or open the contacts 2. The circuit 5 also controls a current flowing in the coil during an inrush phase at the moment of closure of the contacts and during a phase of holding of the contacts closed with reduced energy and control current.

A device 10 for diagnosing the wear of the unit 1 is associated with or forms part of the electrical unit. This device 10 receives a signal representative of an electrical quantity such as the voltage or the current of the coil 4 controlling the contacts. Advantageously, the device 10 is connected in parallel to the coil to receive a voltage signal generated by the coil on opening of the contacts. A current signal flowing in the coil can also be used. However, in a preferential embodiment, a voltage signal is advantageously more stable and easier to use. Thus, the device 10 comprises an analogue-digital converter 6, connected to the coil 4, a diagnostic module 7 connected to the converter to receive the signal and process the diagnostic of the electrical unit, and a device 8 for signalling the state of the electrical unit, in particular its level of contact wear. The diagnostic module 7 can also be connected and process data with another, external or remote processing module 9. In this case, the diagnostic device is in two or more parts. It is also possible for the external parts to be common to several devices or to be centralized. The processing module 9 can ensure the remote signalling of the state of the unit. Obviously, the communications between the modules and the devices are conducted by wire or wirelessly.

Thus, the monitoring and the diagnosing of the wear of the electrical unit such as a contactor is done preferably by the analysis of the voltage of the coil on opening of said contactor. This voltage is representative of the rate of movement of the mobile part of the contactor. In this case, the wear of the contacts results in a reduction of the rate of movement of the mobile part of the electrical unit.

Figure 2:
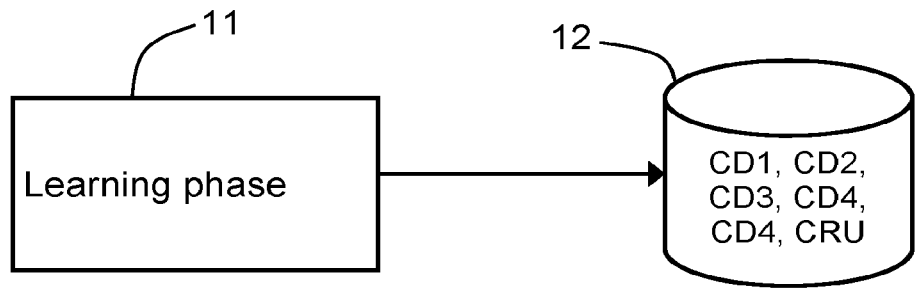
FIG. 2 represents a learning phase of a method according to an embodiment of the invention.

Diagnosing the state of wear of the electrical unit comprises a preliminary learning phase performed on a significant number of products during lifetime cycles of said units. This learning phase makes it possible to acquire learning data which will first of all be stored, modelled and saved then loaded for each unit to be monitored for the monitoring of its specific wear. FIG. 2 illustrates a learning phase 11 and the storage 12 of the learning data.

During the learning phase, measurement curves are acquired on opening of the units in wear cycle. Measurement curves represent an electrical signal which lasts a few tens of milliseconds, for example 30 ms to 50 ms, for an electrical unit of average size. These durations can be very different depending on the size and the type of the units. The signal is generally sampled with a few hundreds of samples, for example between 80 and 500 samples, but a different number can also be used, it will depend on the computation capacity of a processor used in the diagnostic device.

During the learning phase, the electrical units are subjected to quantities of manoeuvres making it possible to follow the life of a unit. For a contactor, the number of manoeuvres can reach for example 800,000, although other values can also be used. Since the quantity of data can be considerable, the trend of the characteristics of the electrical unit is defined by descriptors D1, D2, D3, D4, D5 associated with electrical characteristics and with trend curves CD1, CD2, CD3, CD4, CD5 of said descriptors during the life of an electrical unit. To further reduce the size of the learning data which will subsequently be loaded into the devices of the units to be diagnosed, the trend curves CD1, CD2, CD3, CD4, CD5 of the descriptors are saved in the form of data representative of straight line segments of type a+bx. A trend curve can have several successive straight line segments defining the lifespan of a unit. The set of trend curves of the descriptors CD1, CD2, CD3, CD4, CD5 forms, over the life of a product, a space in several dimensions. Parts, portions of curves or of values of descriptors are associated with wear classes of the electrical unit. Given the number of manoeuvres of the units, the measurement curves are not necessarily acquired upon each opening. The acquisition of the measurement curves can be spaced apart regularly by ranges of number of manoeuvres or, more relevantly, as a function of the trend of the units. For example, the number of manoeuvres may be more frequent at the end of life and very much spaced apart at the start of life.

The learning phase also provides a worn reference curve CRU. This worn reference curve is taken from the measurement curves at the end of life of the units used in the learning. The worn reference curve CRU can be a curve averaged over several measurement curves and/or over several worn units.

Figure 3:
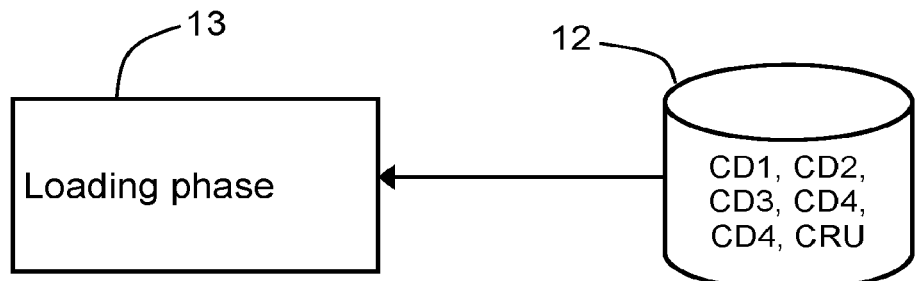
FIG. 3 represents a phase of loading of a device and of a method according to an embodiment of the invention.
Figure 4:
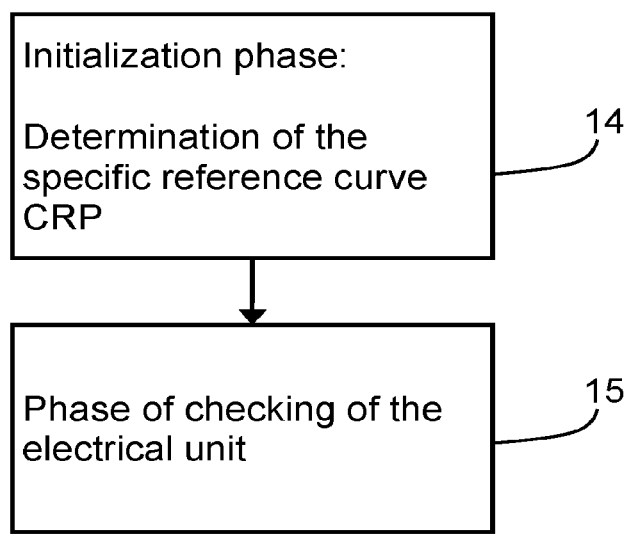
FIG. 4 represents a phase of initialization and of processing of a device and of a method according to an embodiment of the invention.

Thus, at the end of the learning phase, learning data such as the trend curves CD1, CD2, CD3, CD4, CD5 of the descriptors and the worn reference curve CRU are first of all stored, modelled and saved then loaded on each unit for the monitoring of its own wear. These learning data are common to all the monitoring devices associated with one and the same type of unit. FIG. 3 illustrates a phase of loading 13 of learning data previously stored in units to be diagnosed.

In a first preferred embodiment, a diagnostic method according to the invention comprises:
- a preliminary learning phase 11 for recording, during a predetermined number of manoeuvres, learning data representative:
  - of at least one reference curve CRU of a worn unit corresponding to an electrical signal during an opening of said worn unit 1, and
  - of at least two trend curves of descriptors CD1, CD2, CD3, CD4, CD5 representative of predefined characteristics of said electrical signal during the life of said electrical unit,
- a storage of the learning data,
- the loading of the learning data, and
- the use of the learning data in an electrical unit monitoring phase.

In a preferred embodiment, a diagnostic method according to the invention also comprises an initialization phase 14 for determining initialization data comprising a determined specific reference curve CRP of the product to be monitored, and the use of said initialization data in said electrical unit monitoring phase 15.

In the monitoring phase, local descriptors DL1, DL2, DL3, DL4, DL5 specific to each unit to be monitored are determined during the acquisition of measurement curves CM. These descriptors are of the same type as those which were used to create the global trend curves CD1, CD2, CD3, CD4, CD5 of the descriptors. In the preferred embodiment comprising five descriptors D1, D2, D3, D4, D5, these descriptors will respectively give five global trend curves CD1, CD2, CD3, CD4, CD5 previously created, saved and loaded, and, respectively, five local descriptors DL1, DL2, DL3, DL4, DL5 specific to each unit derived from measurement curves on opening of the electrical unit.

Figure 5:
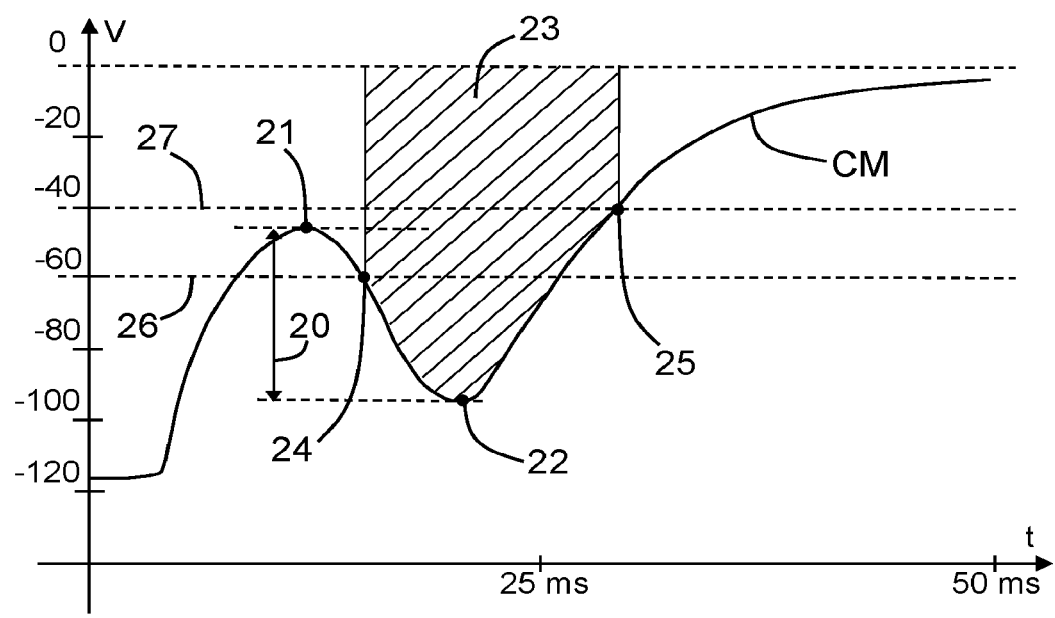
FIG. 5 represents a measurement curve of a signal during the opening of an electrical unit to be monitored.

FIG. 5 shows a measurement curve CM representative of an electrical voltage signal of a control coil on opening of an electrical unit. Such a curve can be both a measurement curve CM during the phase of monitoring of an electrical unit and a measurement curve during the learning phase for creating the trend curves of the descriptors.

Figure 7:
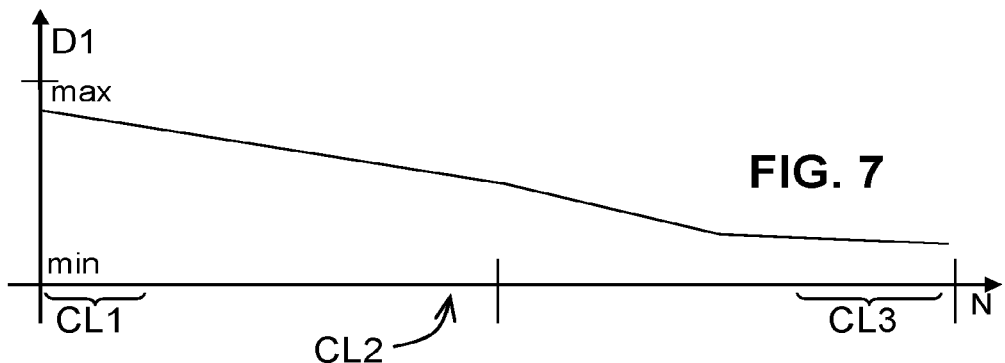
FIGS. 7 to 11 represent trend curves of descriptors generated in a learning phase and used for a device and a method according to an embodiment of the invention.

A first descriptor D1 is representative of the deviation or the difference 20 in value between two noteworthy points 21 and 22 of the measurement curve CM. These points 21 and 22 are advantageously points of change of direction of the variation of the signal or a change of sign of the drift of said measurement signal. On a first point 21, the signal was increasing then decreasing in relative values, and on a second point 22, the signal was decreasing then increasing in relative values. The deviation in value between the first point 21 and the second point 22 tends to be reduced during the life of the product. FIG. 7 illustrates a curve CD1 representative of the trend of this descriptor D1.

Figure 8:
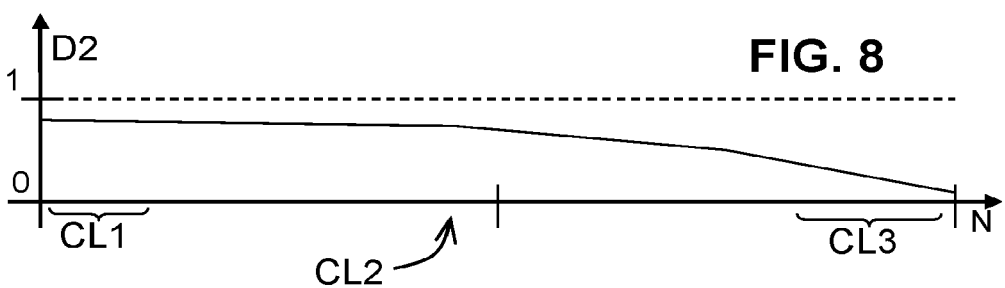

A second descriptor D2 is representative of the deviation, of the variation, of the difference, or of the correlation between a measurement curve CM of a signal to be measured and an initial or specific reference curve CRP of a product to be monitored. For example, in normed values, this descriptor can have a value close to "1" if the measured curve CM is close to the specific or initial reference curve CRP and a value close to zero "0" if the measured curve CM is very different or distant from the specific or initial reference curve CRP. During the life of the product, the value of the descriptor D2 changes from a value close to 1 to a value close to zero. FIG. 8 illustrates a curve CD2 representative of the trend of this descriptor D2. Consequently, the more distant the measurement curve CM is from the specific reference curve CRP, the more the unit will be considered to be worn.

Figure 9:
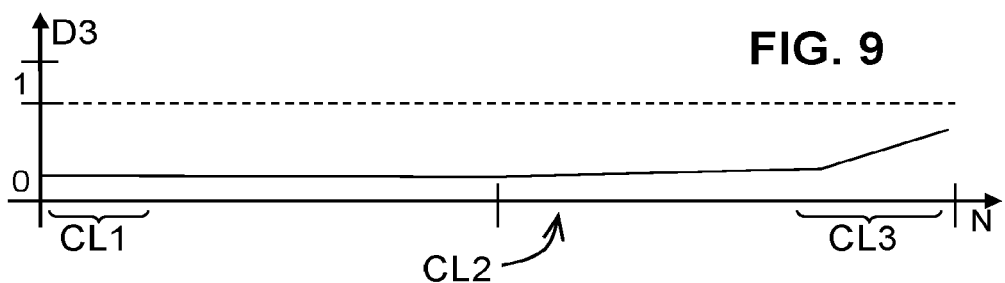

A third descriptor D3 is representative of the deviation, of the variation, of the difference, or of the correlation between a measurement curve CM of a signal to be measured and a worn reference curve CRU of a product to be monitored. The worn reference curve having been loaded previously. For example, in normed values, this descriptor can have a value close to zero "0" if the measured curve CM is very different or distant from the worn reference curve CRU and a value close to "1" if the measured value CM becomes close to the worn reference curve. During the life of the product, the value of the descriptor D3 changes from a value close to "0" to a value close to "1". FIG. 9 illustrates a curve CD3 representative of the trend of this descriptor D3. Consequently, the closer the measurement curve CM is to the worn reference curve CRU, the more the unit will be considered to be worn.

Figure 10:
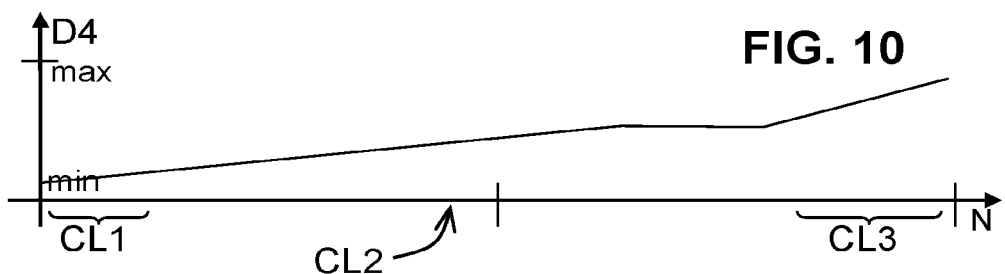

A fourth descriptor D4 is representative of an integral 23 of the signal of the measurement curve CM between two noteworthy points 24 and 25. Advantageously, the noteworthy points can be, respectively, a first threshold 26 after the first change of direction of the variation of the signal and a second threshold 27 after the second change of direction of the variation of the signal. During the life of the product, the value of the descriptor D4 decreases in absolute value. In the embodiment described, the value is negative and approaches zero showing an upward curve. FIG. 10 illustrates a curve CD4 representative of the trend of this descriptor D3.

Figure 6:
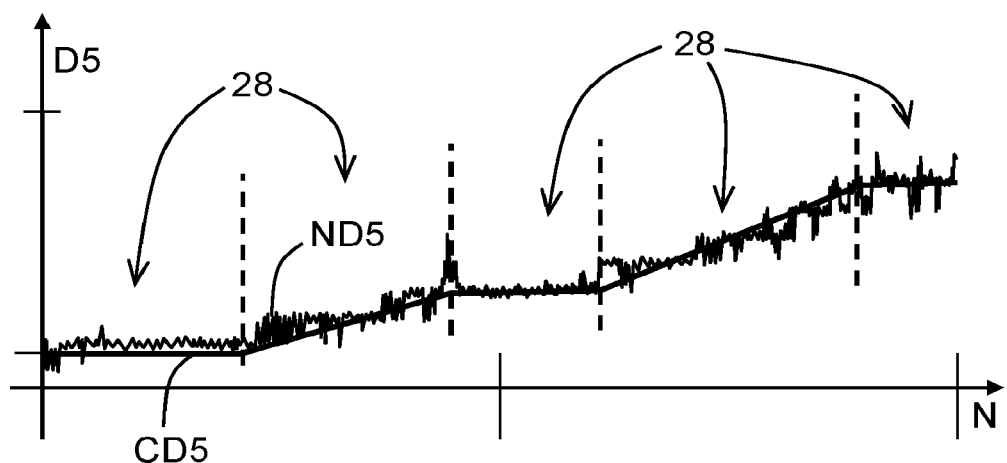
FIG. 6 represents a modelling of a descriptor for a device and a method according to an embodiment of the invention.
Figure 11:
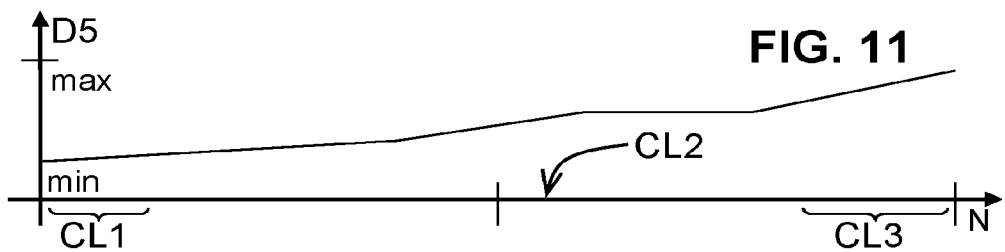

A fifth descriptor D5 is representative of the value of a noteworthy point 22 of the measurement curve CM. This point is advantageously a point of change of direction of the variation of the signal or of change of sign of the drift of said measurement signal. Preferably, a noteworthy point can be a point 22 of second change of sign where the signal is decreasing then increasing in relative values. FIG. 11 illustrates a curve CD5 representative of the trend of this descriptor D5. This curve is derived from a learning curve shown in FIG. 6. In this FIG. 6, during the learning phase, very many measurements of the descriptor D5 were performed and shown by a curve ND5. Then, these many values were modelled as straight-line segments to give the trend curve of the descriptor CD5 to be loaded into the units to be monitored. This curve of FIG. 11 comprises, for example, five segments 28. The number of segment is unlimited, but advantageously lies between 1 and 20. However, other embodiments are possible, for example by levels or by polynomials.

At the start of global trend curves CD1, CD2, CD3, CD4, CD5 of the descriptors, the descriptors are associated with particular classes CL1 of new units or units being burned in whereas, at the end of curves, the descriptors are associated with classes CL3 of worn units. Between the classes CL1 and CL3, the descriptors are associated with classes CL2 of units in normal operation.

The use of at least two or more descriptors D1, D2, D3, D4, D5 makes it possible to detect with greater accuracy or certainty the state of wear of an electrical unit to be monitored. The descriptors described above depend on electrical quantities. However, other descriptors can also be used by combining electrical quantities and environmental quantities such as the temperature or the horizontal position or vertical position of a unit. Such quantities can be used to select descriptors as a function of the environment. The curves of descriptors can also be selected as a function of the particular type of use of the electrical unit. Parameterization data making it possible to define the type of product or of electrical unit and the use of said unit are also loaded with the corresponding learning data during the loading phase.

Figure 12:
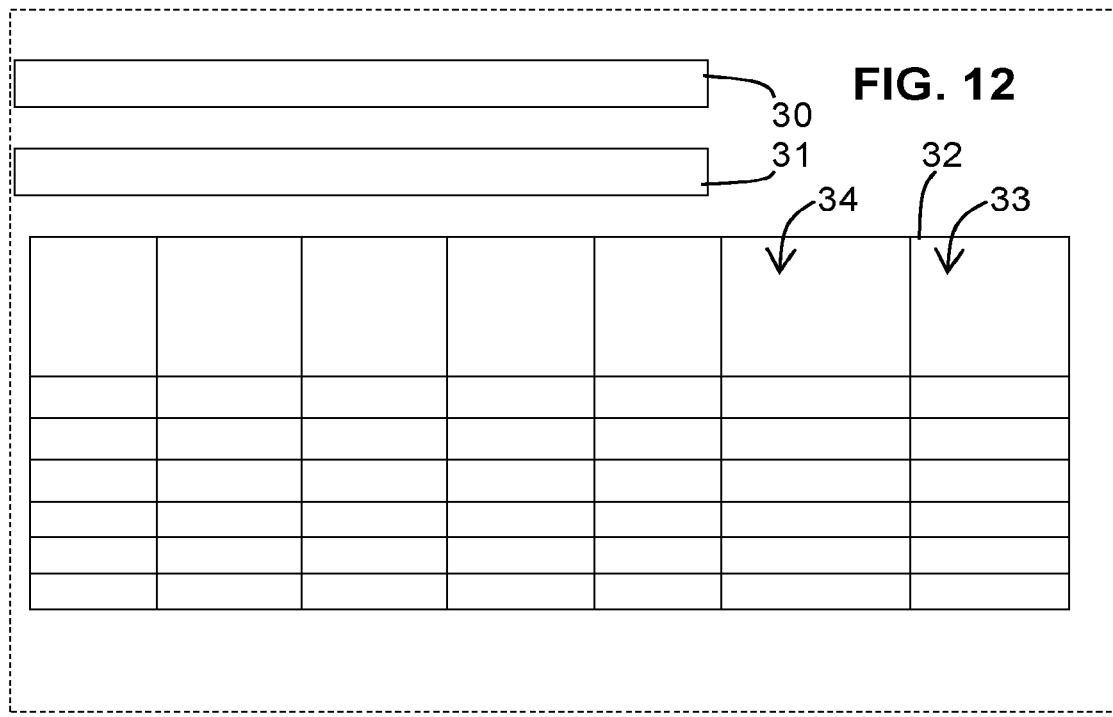
FIG. 12 shows decision tables using descriptors and trend curves of descriptors.

FIG. 12 shows examples of values of descriptors D1, D2, D3, D4, D5 and their comparison or positioning relative to trend curves of the descriptors CD1, CD2, CD3, CD4, CD5 according to an embodiment of the invention. The box 30 shows a formatting of a measurement curve CM as five descriptors Pt1={D1; D2; D3; D4; D5}. The box 31 gives normed values of these descriptors corresponding to a measurement point or a measurement curve Pt1 {51; 0.996; 0.881; −70; −87}. The box 32 shows the closest situations by ranking them from the smallest global deviation (33). In this case, there are six closest situations (34) having three wear classes 1, two classes 2 and one class 3. If the decision is made on the five closest situations, then the result will be the majority wear class, that is to say the class 1.

When the learning data are loaded onto a device ready to apply the diagnoses of the wear of an electrical unit such as a contactor, an initialization phase makes it possible to store initial data specific to the unit to be monitored. Among these initial characteristics, there is advantageously the acquisition of a specific reference curve CRP. This reference curve is preferably stored after a burning-in of the unit corresponding to a predetermined number of first openings and/or when variations of the measurement curve CM become stable.

Figure 13:
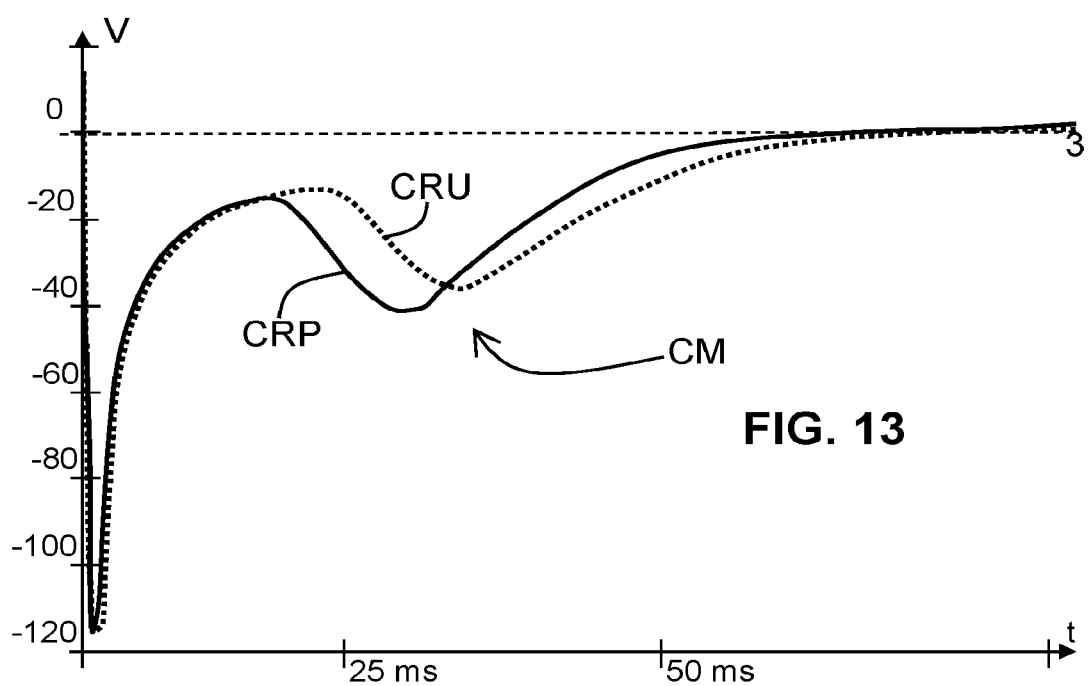
FIG. 13 represents a signal measurement curve for a unit in good or new condition and a signal measurement curve for a worn unit.

FIG. 13 shows two examples of curves. A first new unit measurement curve CM which can also be a specific reference curve CRP, and a worn unit measurement curve CM which can also be a pre-loaded warn unit reference curve CRU. The other measurement curves CM during the life of the unit will be located between these two reference curves CRP and CRU.

Figure 14:
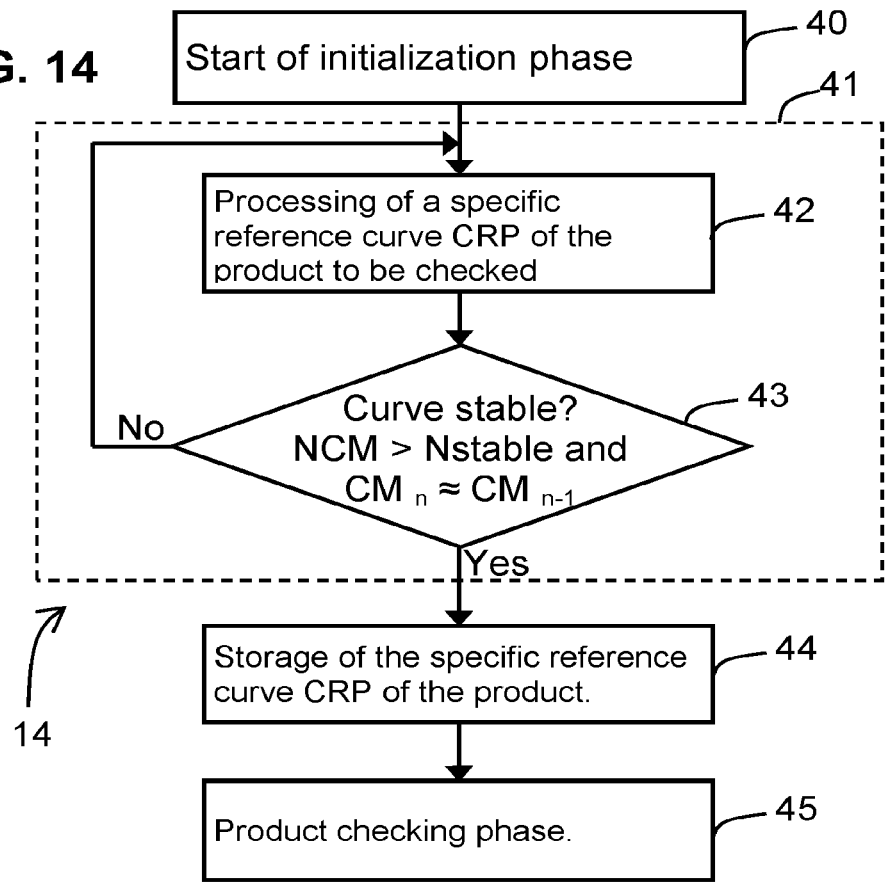
FIG. 14 represents steps of the phase of initialization of a method according to an embodiment of the invention.

FIG. 14 shows a flow diagram representing an initialization phase 14 for determining said initialization data comprising said specific reference curve CRP of the product to be monitored on which the monitoring device is installed or with which it is associated. A step 40 shows the start of the initialization phase. A process 41 of determination of a specific reference curve CRP comprises a processing step 42 in which consecutive measurement curves are acquired and a step 43 of monitoring of the stability of the curve. The curve CM is recognized stable after a predetermined number of measurements Nstable, and/or when the measurement curve CM varies very little between two consecutive measurements CMn and CMn−1.

In a step 44, the measurement curve CM is saved as specific reference curve CRP. After a minimum number of manoeuvres when the deviations between the curves after each opening become low, this curve is representative of the electrical characteristics of the voltage or of the current at the start of life of the product after burn-in. It remains valid until the end of life of the product. In another embodiment, to further improve the stability of the curve to be saved, the specific reference curve CRP can also be an average of several stable curves CM.

This specific reference curve CRP is in particular used to determine at least one descriptor D2 in the phase of monitoring 15 of said electrical unit.

Figure 15:
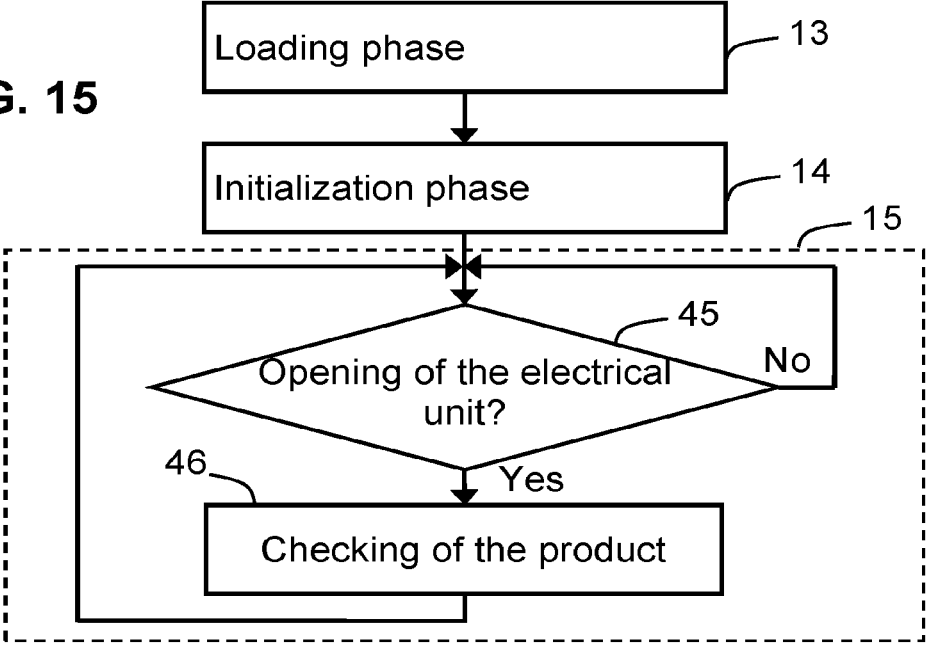
FIG. 15 represents a monitoring phase of a method according to an embodiment of the invention.

FIG. 15 shows that, after the loading phase 13 in which learning data corresponding to a type of product representative of said electrical unit are previously loaded, and the initialization phase 14 in which initialization data corresponding to said unit to be monitored are stored, a monitoring phase 15 initiates the monitoring on opening of the electrical unit.

In this particular embodiment, a step 45 detects the opening of the electrical unit. When the opening is detected, a step 46 performs the monitoring of the unit. This detection can be performed by a signal external to the device or by the analysis of the measurement signal or of its variation. The monitoring phase is preferably initiated upon each opening of the electrical unit. However, it can also be initiated with greater spacing, for example after a predetermined number of openings. The monitoring can also depend on the lifespan of the unit, for example the monitoring can be less frequent at the start of life after burn-in and more frequent at the end of life for greater accuracy.

FIG. 16 shows a flow diagram of a monitoring phase 15 with a detail of a monitoring step 46 according to an embodiment of the invention.

Said monitoring phase comprises:
in a step 50, the measurement and the acquisition of a measurement curve CM on opening of the unit to be monitored,
in a step 51, the determination of values of local descriptors DL1, DL2, DL3, DL4, DL5 of the measurement curve CM as a function of said measurement curve CM, saved initialization data CRP, and of first learning data such as the worn reference curve CRU,
in a step 52, the determination of the positioning of the values of descriptors DL1, DL2, DL3, DL4, DL5 of the measurement curve CM relative to second learning data loaded such as trend curves of descriptors CD1, CD2, CD3, CD4, CD5,
in steps 53-55, the determination of an overall status class as a function of said values of positionings of the values of descriptors DL1, DL2, DL3, DL4, DL5 of the measurement curve CM relative to second learning data loaded.

Preferably, the determination of an overall status class comprises:
in a step 53, the determination of points or of deviations that are the closest between the values of local descriptors DL1, DL2, DL3, DL4, DL5 of the measurement curve CM and the corresponding trend curves of descriptors CD1, CD2, CD3, CD4, CD5, in a step 54, at least three determinations of intermediate status classes CLI as a function of closest positionings of the descriptors relative to said trend curves of descriptors, in a step 55, the selection of said overall class as a function of results of said intermediate classes, and in a step 56, the signalling or the communication of the overall wear class of the unit.

In the step 53, the determination of the closest deviations can be done preferably globally for example with a point defined by the values of all the descriptors. However, it can also be done individually on each descriptor or in a mixed or semi-global manner with a part of the descriptors grouped together and another part individually.

In the step 56, the device 8 signalling the state of the electrical unit can display the overall wear class with an indicator lamp or a distinct channel. However, class values can be grouped together, in particular a class of unit being burned in and a normal operation class can be signalled grouped or together on a single signal.

The above description refers to five descriptors, but other descriptors can be used to characterize the behaviour of an electrical unit during its life or its lifespan. The number of descriptors can also be different, from one descriptor the method and the device make it possible to take advantage of the embodiments of the invention. However, a large number of descriptors makes it possible to have a more accurate result of the identification of the wear classes.

According to one embodiment of the invention, the device for diagnosing the state of wear of an electrical switching unit is connected to an electromagnetic coil actuating contacts of an electrical switching unit. It comprises a processing circuit for implementing the diagnostic method described above.

An electrical unit comprising power electrical contacts actuated by an electromagnetic control coil according to the invention comprises a device for diagnosing the state of wear of an electrical switching unit connected to said electromagnetic coil actuating said contacts to implement the diagnostic method described above.

The device and the method can be implemented permanently or temporarily on the unit to be monitored. They can also be implemented on electrical units already installed. Furthermore, some steps of the method can be performed locally close to the unit and other steps can be performed remotely or in a centralized manner. For example, the acquisitions of the curves CM can be local and the rest of the processing can be performed remotely for more sophisticated computations. In this case, the processing operations are shared between a local module 7 and a remote module 9 as represented in FIG. 1.

Several types of loads or of categories of use are identified in the learning and monitoring phases. The processing of the types of loads is done preferably globally during the learning phase so as to take account of the different situations. For example, several units will be used over a lifespan for different types of load. The trend curves of the descriptors will be representative of curves with units having had different loads or conditions of use.

The categories of use for electrical units such as electrical contactors depend in particular:

on the type of load: non-inductive, inductive, ring motor, case motor;

on the type of control: powering up, breaking, starting up, braking, running in fits and starts;

on the type of applications: distribution, heating, compressor, ventilation, lifts, pumps, various machines; and/or on combinations of several criteria.

It is also possible to identify a type of load or a particular use and to characterize the method accordingly. For example, for capacitive or other loads.

Wear classes for each category of use are defined by descriptors. They make it possible to characterize the state of the product and have an indication of the lifespan of the product.

A nonlimiting list of the main classes can be:

Class 1: new product or product being burnt in

Class 2: product in use

Class 3: worn product

Class 4: product at end of life

In the preferential embodiments described above, the assessment of the wear of the contacts is done advantageously from the measurements of the voltage of the coil of the contactor. However, other signals can be used, in particular a signal representative of a current flowing in the coil.

The invention claimed is:

1. A diagnostic method for diagnosing a state of wear of an electrical switching circuit component, comprising:

monitoring of said electrical circuit, wherein said monitoring includes using:

first learning data loaded previously and corresponding to a type of product representative of said electrical circuit, and initialization data corresponding to said electrical circuit to be monitored and stored in an initialization phase and comprising at least one reference curve specific to the type of product to be monitored saved at a start of a life of the type of product, said monitoring further comprises:

measuring and acquiring a measurement curve on opening of said electrical circuit, determining values of local descriptors of said measurement curve as a function of values of said measurement curve, of saved initialization data, and of the first learning data loaded, determining a positioning of values of local descriptors of the measurement curve relative to second learning data, the second learning data including descriptor trend curves of a deviation or a difference in value between two points of the measurement curve, a deviation of a variation, of a difference, or of a correlation between the measurement curve and the initialization data, a deviation, of a variation, of a difference, or of a correlation between the measurement curve and the first learning data, an integral of a signal of the measurement curve between two points, and a value of a point of the measurement curve, and determining an overall status class as a function of said values of the positioning of the values of local descriptors of the measurement curve relative to said second learning data including the descriptor trend curves, wherein the initialization data is stored when variations of the measurement curve become stable, and wherein the first learning data sets comprise at least one reference curve of a worn circuit component corresponding to an electrical signal during an opening of a worn circuit taken from the measurement curves at the end of life of electrical units used in a previous learning.

2. The diagnostic method according to claim 1, wherein the determining of an overall status class comprises:
at least three determinations of intermediate status classes as a function of positionings closest to said local descriptors, and
selecting said overall class as a function of said intermediate status classes.

3. The diagnostic method according to claim 1, wherein a first descriptor is representative of a difference in value between two noteworthy points of said measurement curve.

4. The diagnostic method according to claim 1, wherein a second descriptor is representative of a deviation between a measurement curve and a specific reference curve, the more distant the measurement curve is from the specific reference curve, the more the electrical circuit will be considered to be worn.

5. The diagnostic method according to claim 1, wherein:
a third descriptor is representative of a deviation between a measurement curve and said worn reference curve, a closer the measurement curve is to the worn reference curve, the more the worn circuit will be considered to be worn.

6. The diagnostic method according to claim 1, wherein a fourth descriptor corresponds to a curve surface or to an integral between two noteworthy points of the measurement curve or to two thresholds of values in a first direction of variation and in a second, opposite direction of variation.

7. The diagnostic method according to claim 1, wherein a fifth descriptor corresponds to a variation of value of a noteworthy point including a change of sign of the variation of a signal on the measurement curve.

8. The diagnostic method according to claim 1, wherein the second learning data are representative of trend curves of descriptors representative of predefined characteristics of said electrical signal during a life of said electrical circuit.

9. The diagnostic method according to claim 1, wherein trend curves of descriptors are loaded in a straight line segment definition format to reduce memory space needed for said learning data.

10. The diagnostic method according to claim 9, wherein values of said trend curves of descriptors that are preloaded are associated with status or wear classes of circuits to be monitored.

11. The diagnostic method according to claim 1, further comprising:
a preliminary learning phase for recording, during a predetermined number of manoeuvres, learning data representative:
of at least one reference curve of a worn circuit corresponding to an electrical signal during an opening of said worn circuit, and
of at least two trend curves of descriptors representative of predefined characteristics of said electrical signal during a life of said electrical circuit,
storing said learning data,
loading said learning data, and
using the learning data in said electrical circuit monitoring.

12. The diagnostic method according to claim 1, further comprising an initialization phase for determining said initialization data comprising a specific reference curve of the product to be monitored determined:
after a predetermined number of measurements, and/or when the measurement curve varies very little between two consecutive measurements,
saving said specific reference curve, and
using the initialization data in said electrical circuit monitoring.

13. The diagnostic method according to claim 1, wherein the descriptor trend curves are a plurality of curves generated based on the measurement curve.

14. A device for diagnosing the state of wear of an electrical switching circuit connected to an electromagnetic coil actuating contacts of said electrical switching circuit, wherein the diagnostic device comprises a processing circuit for implementing the diagnostic method according to claim 1.

15. The diagnostic device according to claim 14, wherein the processing circuit comprises a local diagnostic processing module close to said electrical switching circuit linked to an external processing module remote from said electrical switching circuit.

16. An electrical circuit, comprising:
power electrical contacts actuated by an electromagnetic control coil; and
a device for diagnosing a state of wear of an electrical switching circuit component connected to said electromagnetic coil actuating said contacts and configured to:
monitor said electrical circuit using first learning data loaded previously and corresponding to a type of product representative of said electrical circuit, and initialization data corresponding to said electrical circuit to be monitored and stored in an initialization phase and comprising at least one reference curve specific to the type of product to be monitored saved at a start of a life of the type of product,
measure and acquire a measurement curve on opening of said electrical circuit,
determine values of local descriptors of said measurement curve as a function of values of said measurement curve, of saved initialization data, and of the first learning data loaded,
determine a positioning of values of local descriptors of the measurement curve relative to second learning data, the second learning data including descriptor trend curves of
a deviation or a difference in value between two points of the measurement curve,
a deviation of a variation, of a difference, or of a correlation between the measurement curve and the initialization data,
a deviation, of a variation, of a difference, or of a correlation between the measurement curve and the first learning data,
an integral of a signal of the measurement curve between two points, and
a value of a point of the measurement curve, and
determine an overall status class as a function of said values of the positioning of the values of local descriptors of the measurement curve relative to the second learning data including the descriptor trend curves,
wherein the initialization data is stored when variations of the measurement curve become stable, and
wherein the first learning data sets comprise at least one reference curve of a worn circuit component corresponding to an electrical signal during an opening of a worn circuit taken from the measurement curves at the end of life of electrical units used in a previous learning.

* * * * *